(12) United States Patent
Makeig

(10) Patent No.: US 10,726,166 B2
(45) Date of Patent: Jul. 28, 2020

(54) COMPUTER-IMPLEMENTED METHODS FOR GENERATING 3D MODELS SUITABLE FOR 3D PRINTING

(71) Applicant: Prem Makeig, Blooklyn, NY (US)

(72) Inventor: Prem Makeig, Blooklyn, NY (US)

( * ) Notice: Subject to any disclaimer, the term of this patent is extended or adjusted under 35 U.S.C. 154(b) by 247 days.

(21) Appl. No.: 15/985,500

(22) Filed: May 21, 2018

(65) Prior Publication Data

US 2018/0268086 A1    Sep. 20, 2018

Related U.S. Application Data

(62) Division of application No. 14/011,148, filed on Aug. 27, 2013, now Pat. No. 9,977,840.

(51) Int. Cl.
*G06F 30/00* (2020.01)
*B29C 64/386* (2017.01)
*B33Y 50/00* (2015.01)

(52) U.S. Cl.
CPC ............ *G06F 30/00* (2020.01); *B29C 64/386* (2017.08); *B33Y 50/00* (2014.12); *Y02T 10/82* (2013.01)

(58) Field of Classification Search
CPC ...... G06F 17/50; B29C 67/0088; Y02T 10/82

USPC .......................................................... 700/98
See application file for complete search history.

(56) References Cited

U.S. PATENT DOCUMENTS

| | | | |
|---|---|---|---|
| 2005/0081161 A1* | 4/2005 | MacInnes | G06T 19/20 715/765 |
| 2011/0295378 A1* | 12/2011 | Bojarski | A61F 2/30942 623/20.35 |
| 2012/0209394 A1* | 8/2012 | Bojarski | A61F 2/38 623/20.32 |
| 2013/0211531 A1* | 8/2013 | Steines | A61F 2/4684 623/20.35 |
| 2013/0230827 A1* | 9/2013 | Kwon | A61C 3/02 433/183 |

* cited by examiner

*Primary Examiner* — Ziaul Karim
(74) *Attorney, Agent, or Firm* — Jie Tan; JT Law Services, PC

(57) ABSTRACT

Computer-implemented processes for allowing a user with limited technical knowledge to easily design 3D models. The 3D models generated by such processes may be 3D printed, as the models are solid, which is necessary for 3D printing. Each of these computer-implemented processes takes a small amount of simplified user input and generates one of a number of different 3D models. More specifically, based on the user input, the computer-implemented processes automatically generate CAD primitives, and automatically perform certain CAD operations on those primitives, such that a 3D model is generated.

18 Claims, 15 Drawing Sheets

Third Ellipsoid Method

First and Second Ellipsoid Methods

Fourth and Fifth Ellipsoid Methods

First and Second Tubular Methods

Fifth Tubular Method

Sixth Tubular Method

COMPUTER-IMPLEMENTED METHODS FOR GENERATING 3D MODELS SUITABLE FOR 3D PRINTING

CROSS-REFERENCE TO RELATED APPLICATION

This invention is a continuation of the U.S. patent application Ser. No. 14/011,148 filed on Aug. 27, 2013, which claims the priority of the U.S. provisional application Ser. No. 61/694,355, filed on Aug. 29, 2012. The provisional application in its entirety is incorporated by reference herein.

TECHNICAL FIELD

The invention is in the field of 3D CAD ("computer aided design") modeling. More specifically, this disclosure is directed to computer-implemented methods for generating 3D models with minimal user input.

BACKGROUND

A general explanation of 3D CAD software, including an explanation with respect to 3D CAD software modeling, as well as the process by which a modeled 3D shape can be converted into an actual 3D object ("3D printing"), follows.

Traditionally, 3D objects are constructed and edited in 3D CAD modeling software. A large amount of technical knowledge is needed to create a desired 3D object, both regarding 3D CAD modeling in general as well as the specific 3D CAD software to be used. Such knowledge includes, for example, knowledge about the elemental components of 3D models. When modeling using 3D software, a user starts with an empty three-dimensional modeling space. A variety of different types of objects, each having up to three dimensions may be created and placed in the 3D space, including Points (0-dimensional objects); Lines and line segments (1-dimensional objects); Curves (2- or 3-dimensional objects); Planes (2-dimensional objects); Curved surfaces (3-dimensional objects); Regular 2-dimensional shapes such as squares, circles, etc; and Regular 3-dimensional shapes such as spheres, cubes, cylinders, etc. These objects may be referred to as "geometric primitives." It should be noted that some primitives may be a collection of simpler primitives. For example, a triangle may be a collection of points.

These items are called "primitives" because they consist of only the most fundamental geometric shapes. While they may be used alone to construct a very simplistic "scene" of objects, modeling of more complex, realistic 3D shapes requires more than just creation and placement of these primitives. This is where technical expertise is needed.

To create a desired object, primitives and 3D models are manipulated using a number of different operations. Some examples of such operations include "extrusion", in which a 2-dimensional shape is extended in a specific direction from the plane defined by the 2-dimensional shape to create a 3-dimensional version of that shape; "subtraction", in which a three-dimensional object is "subtracted" from another three-dimensional object to create a new shape; and vertex editing, in which individual points or vertices of a 3D model are repositioned to alter the shape of the 3D model. These are simply examples, and a very large number of these types of operations may be performed. Specialized techniques for using these operations in very specific ways have also been developed and are generally known to people having a high degree of 3D modeling skill. This high level of knowledge requirements leads to a very high learning curve, which puts accurate or useful 3D modeling out of the reach of unskilled persons selected by the user.

In addition to creation of 3D computer models, a user may also "3D print" their 3D models. "3D printing" consists of providing a 3D model to a 3D printing software, which issues instructions to a 3D printer, which creates a physical object having the same shape as the 3D model. Not all 3D models created using 3D modeling software may be 3D printed. There are a large number of requirements for a 3D model to be 3D printable. The most important requirement is that the model is solid. Additional requirements may include the following: 1) Surface normals in the 3D model must point in correct directions—specifically, outer surfaces must have surface normals which point in an outward direction, while inner surfaces must have surface normals pointing in an inward direction; 2) The 3D model must be free of holes and open edges; 3) Duplicate surfaces should not exist; 4) To keep the part from breaking once it is printed, details should not be too small; 5) To save printer material and reduce space, it is beneficial to "hollow" the part. Note that requirements may vary with the CAD software and 3D printing system.

Thus, in addition to the skills required for accurately creating 3D models, a user must be familiar with the requirements for creating 3D printable models in order to create an actual object from a created 3D model, and must have the expertise required to edit the model to conform to those requirements.

There have been attempts in the past to provide software permitting users with little or no technical knowledge to generate 3D models. One example is a software called "Rhonda."

"Rhonda Forever" is computer software allowing a user to "draw" three-dimensional artistic drawings. As shown in videos of Rhonda Forever, Rhonda Forever allows a user to create line drawings three dimensions by allowing a user to aggregate a series of two-dimensional line drawing elements. To do this, a user draws two-dimensional drawing elements into the plane of the screen or drawing surface. These two-dimensional drawing elements are added into an overall three dimensional line drawing object, which can be moved and rotated, such that a user may insert drawing elements a any angle.

There are a number of drawbacks with the Rhonda software system. First, it appears that Rhonda only permits creation of line drawings. Solid objects cannot be created with Rhonda. Rhonda would therefore not lend itself well to the process of 3D printing. Second, Rhonda is a standalone program and is not built within a larger CAD package, so it is very limited in terms of working within a more complex 3D CAD environment. Third, the interface for Rhonda uses simultaneous mousing and drawing which can be confusing for users. Finally, drawing using Rhonda is time consuming, as all lines in the drawing are explicitly specified by a user. Thus, while technical knowledge is not a requirement, the creation of aesthetically pleasing drawings is a time consuming process.

SUMMARY OF THE INVENTION

Disclosed herein are computer-implemented processes for allowing a user with limited technical knowledge to easily design 3D models. The 3D models generated by such processes will be solid and thus ready for 3D printing.

Each of these computer-implemented processes takes a small amount of user input ("simplified input") and generates one of a number of different 3D models. More specifically, based on the user input, the computer-implemented processes automatically generate CAD primitives, and automatically perform certain CAD operations on those primitives, such that a 3D model is generated. Further, the CAD primitives that are generated and the operations that are performed create a resulting CAD model which is solid and can therefore be 3D printed.

The computer-implemented processes can be grouped into a number of related methods. In a first group, 3D models of spheres or ellipsoids may be created from input consisting of a curve and an optional indication of a point in 3D space relative to the curve. In a second group, 3D models of elongated free-form tubular structures may be formed from input consisting of at lease one curve, optional selection of points on the curve, and optional additional input consisting of curves designating a cross-section shape or curves designating cross-section orientations.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION

Figure 1:
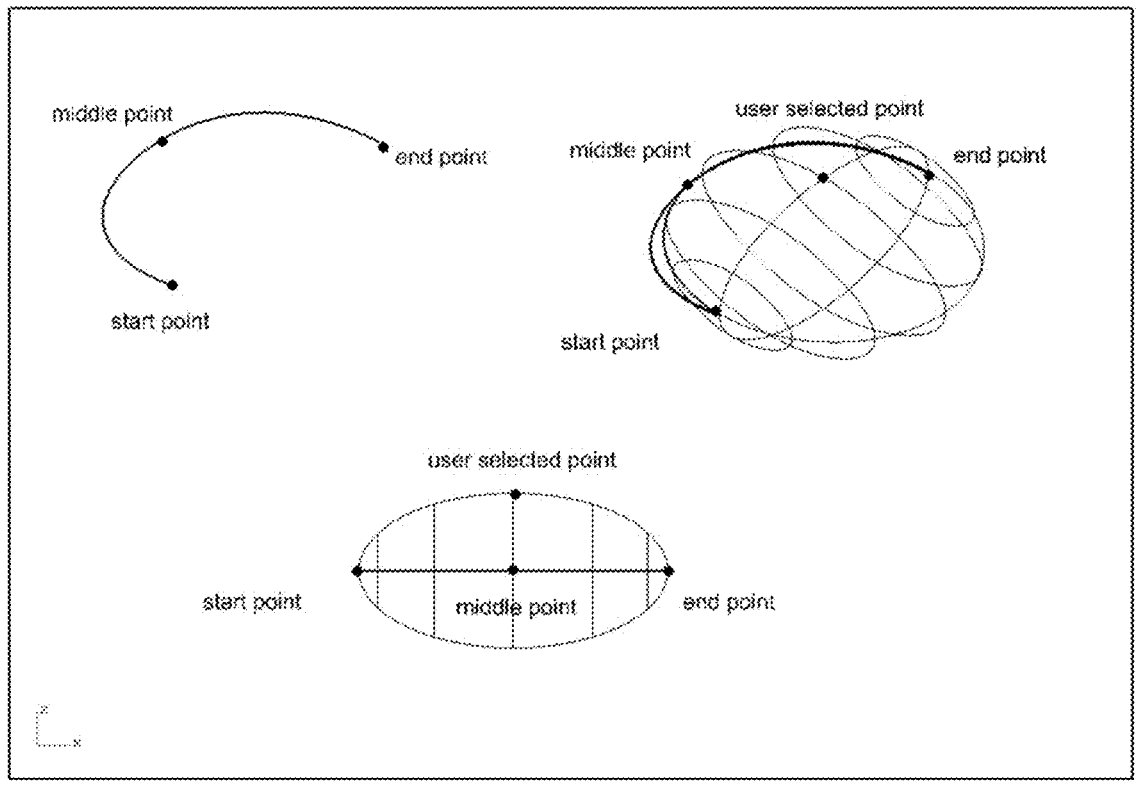
FIG. 1 illustrates an exemplary embodiment of first and second ellipsoid methods, in accordance with aspects of the present invention.
Figure 2:
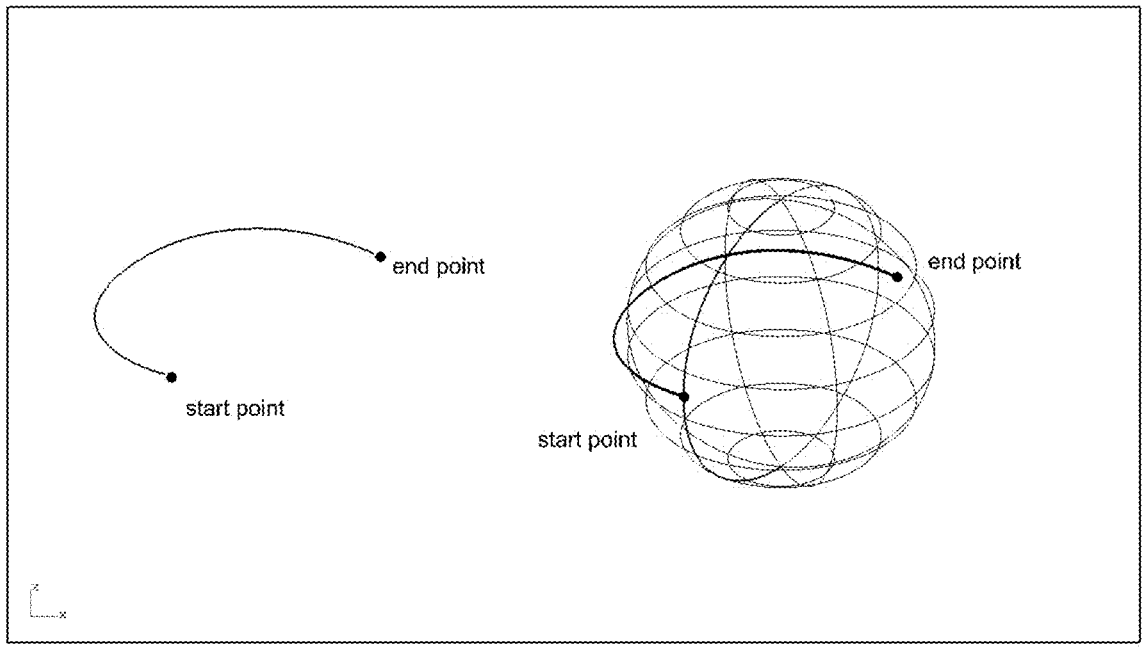
FIG. 2 illustrates an exemplary embodiment of third ellipsoid method, in accordance with aspects of the present invention.
Figure 3:
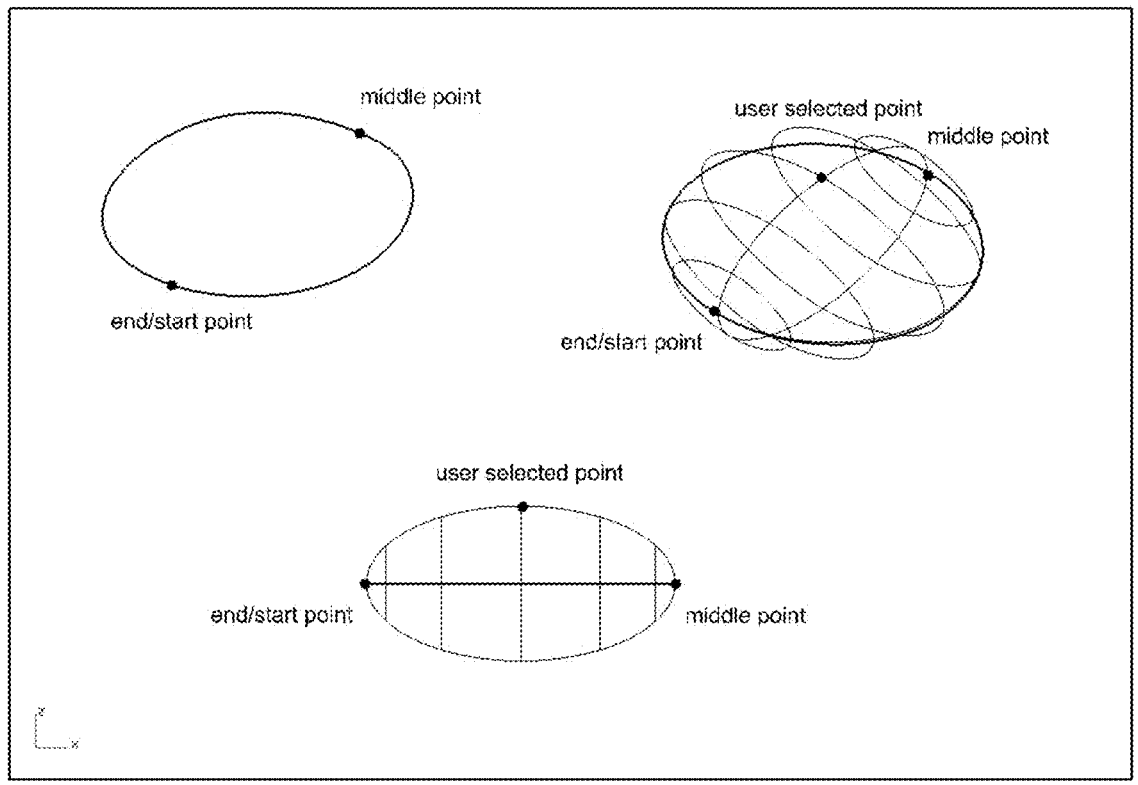
FIG. 3 illustrates an exemplary embodiment of fourth and fifth ellipsoid methods, in accordance with aspects of the present invention.
Figure 4:
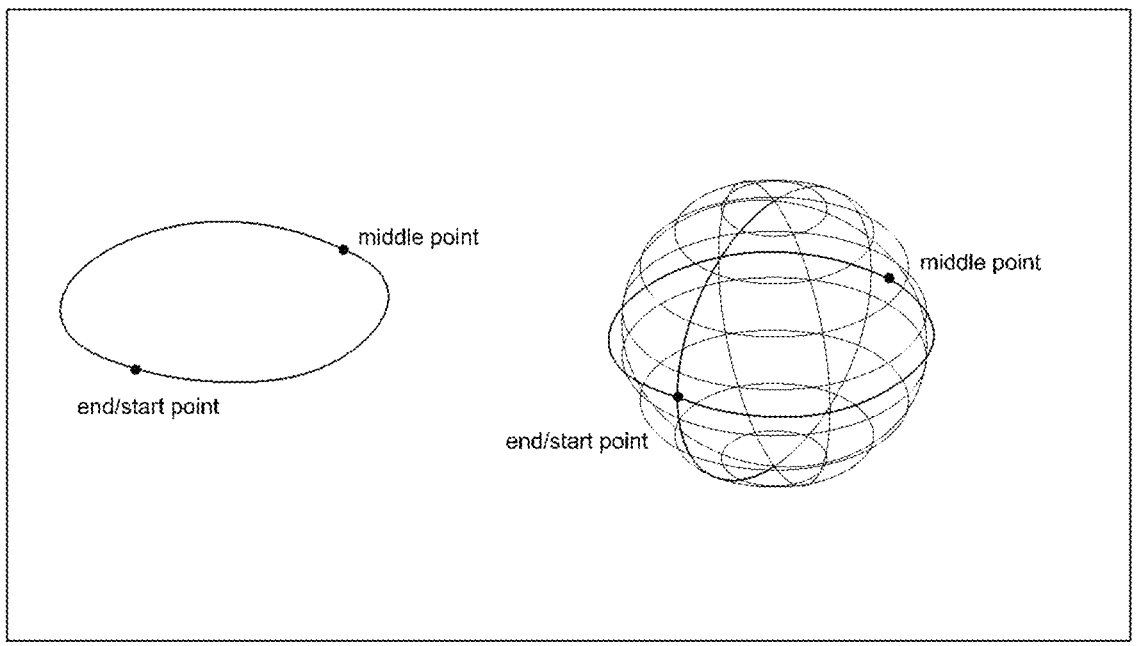
FIG. 4 illustrates an exemplary embodiment of sixth ellipsoid method, in accordance with aspects of the present invention.
Figure 5:
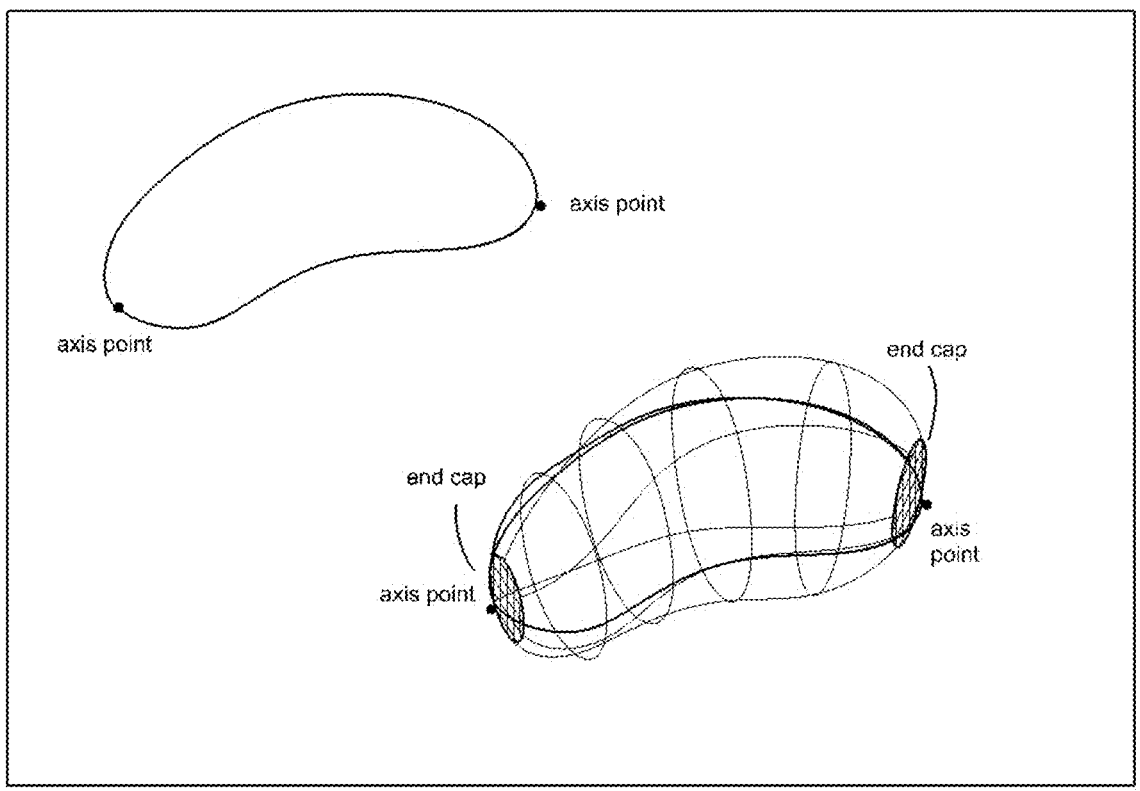
FIG. 5 illustrates an exemplary embodiment of first and second tubular methods, in accordance with aspects of the present invention.
Figure 6:
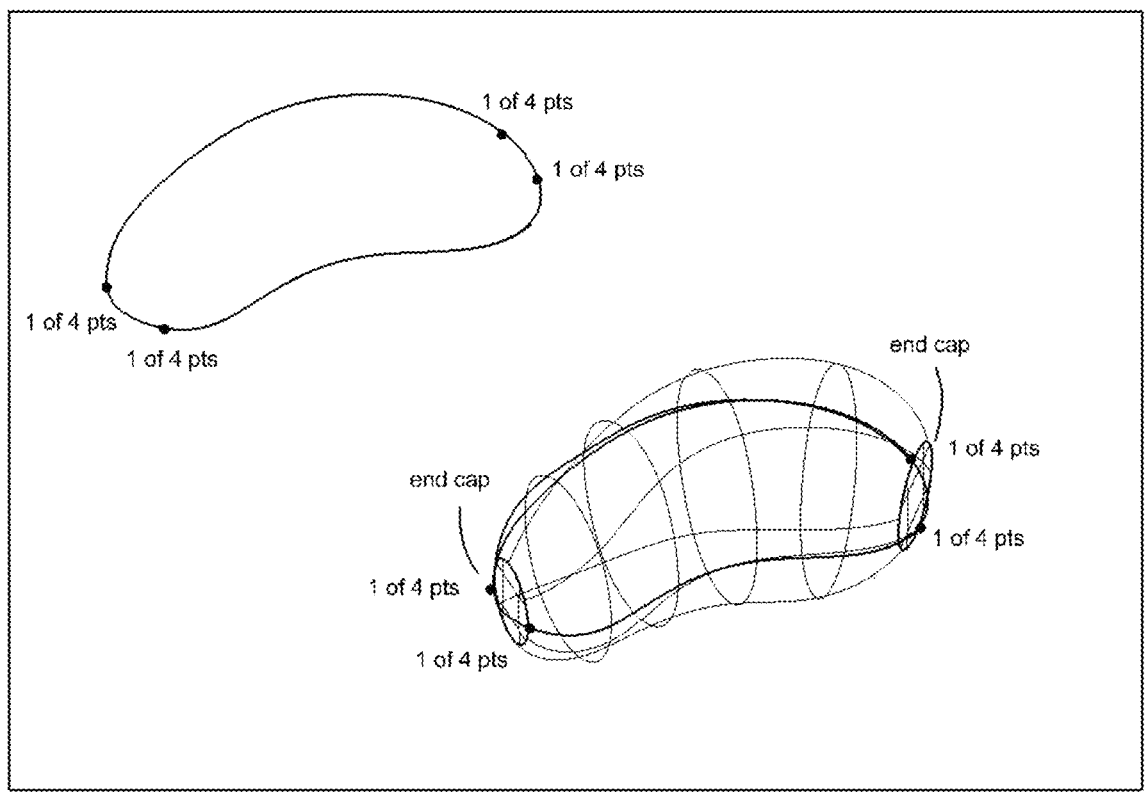
FIG. 6 illustrates an exemplary embodiment of third tubular method, in accordance with aspects of the present invention.
Figure 7:
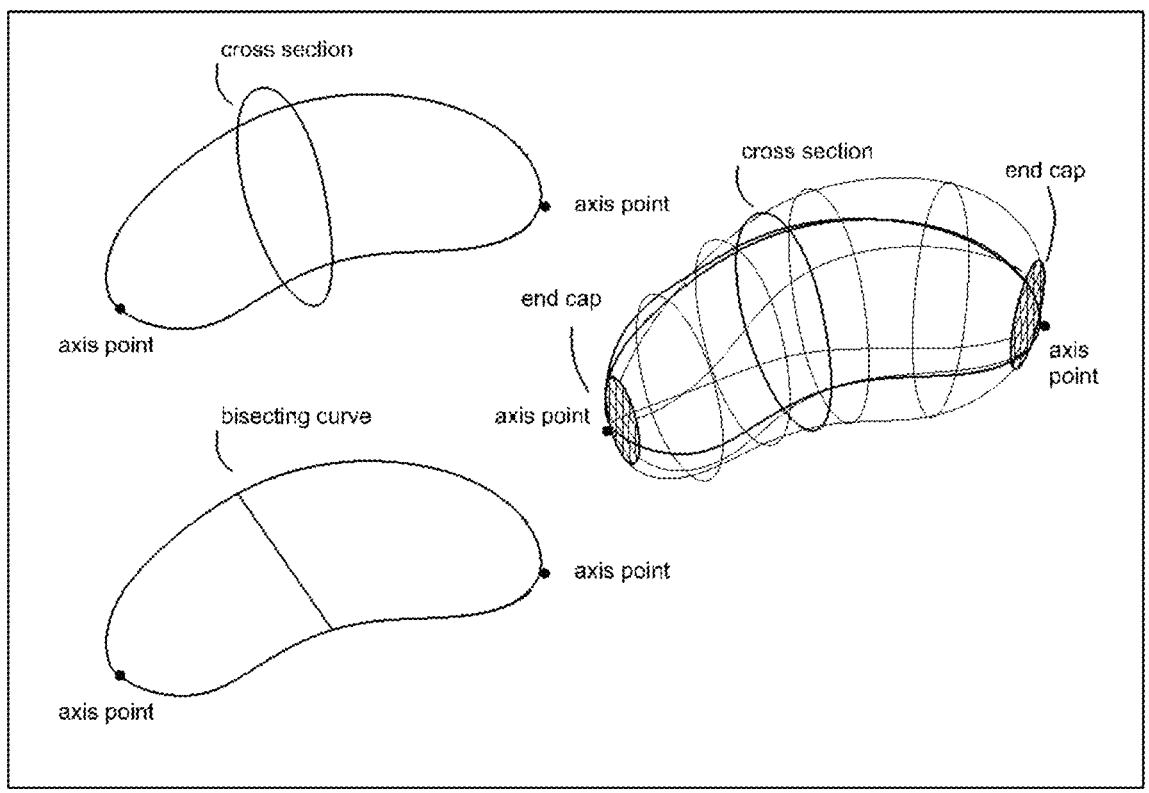
FIG. 7 illustrates an exemplary embodiment of fourth tubular method, in accordance with aspects of the present invention.
Figure 8:
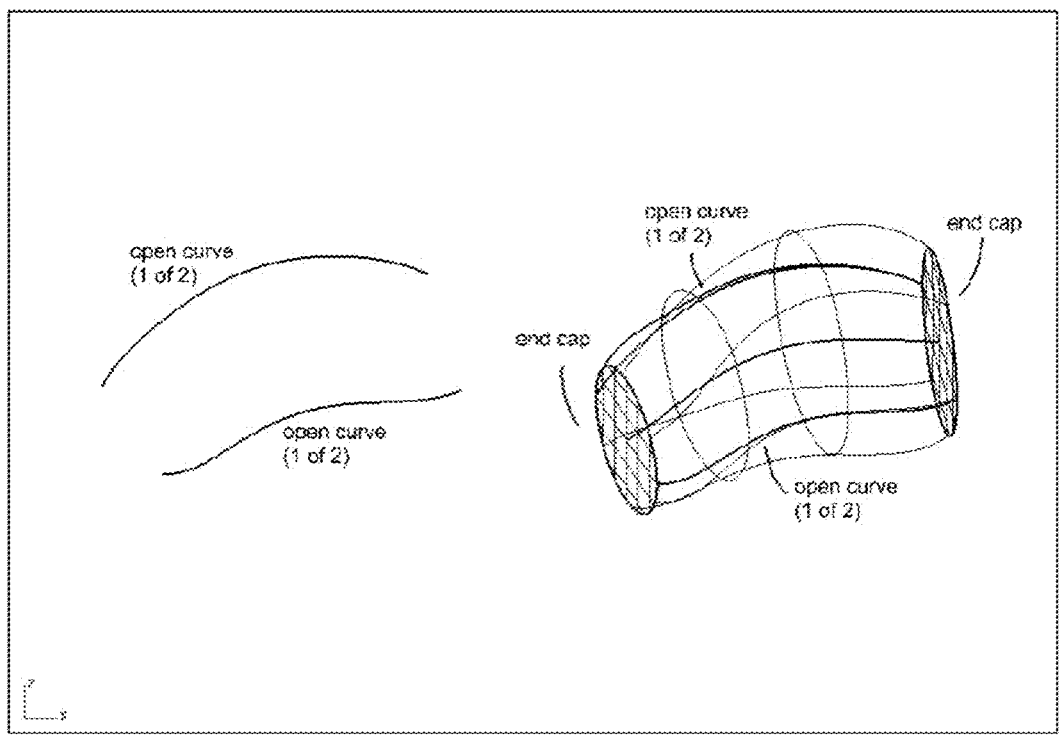
FIG. 8 illustrates an exemplary embodiment of fifth tubular method, in accordance with aspects of the present invention.
Figure 9:
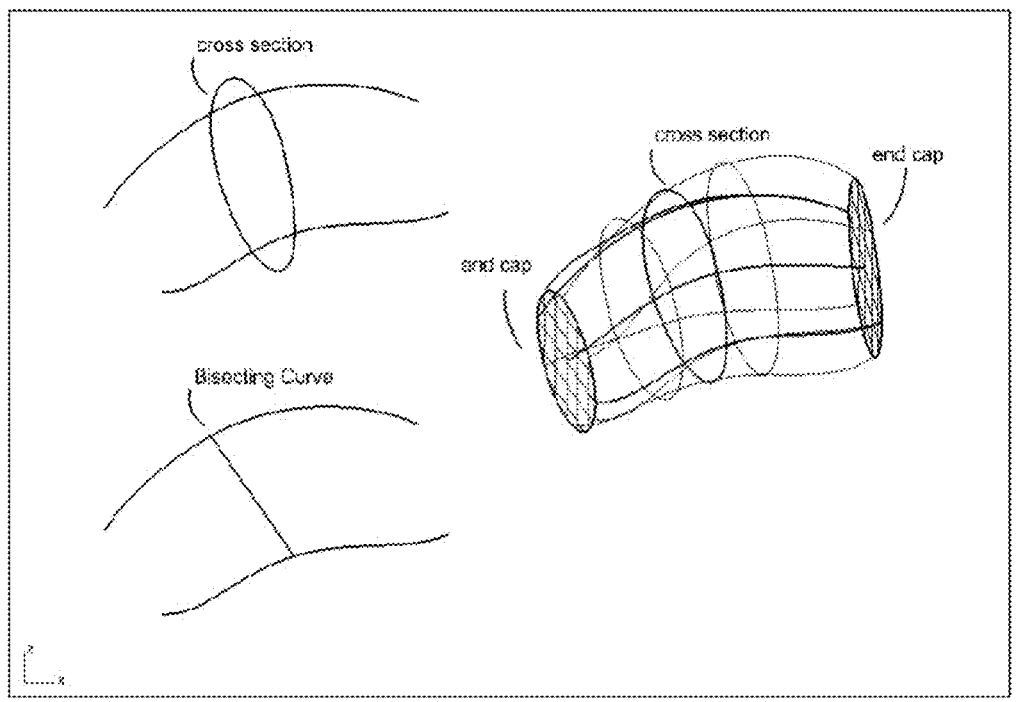
FIG. 9 illustrates an exemplary embodiment of sixth tubular method, in accordance with aspects of the present invention.

The methods disclosed herein are intended to be utilized in the context of computer systems. Such systems generally comprise a processor and volatile memory, where the volatile memory contains instructions which, when executed by the processor, cause a series of desired steps to occur. A logically integrated collection of such instructions is generally referred to herein as "software." Computer systems generally have input and output devices for communicating with one or more users. Such devices generally comprise a display for displaying output, such as a monitor, and devices for accepting input, such as a keyboard and mouse. Other known devices, such as, for example, a touch screen tablet computer, may of course also be used.

The methods disclosed herein are also intended to be utilized in the context of CAD (computer aided design) software. For example, the methods disclosed herein can be implemented as a software module working in conjunction with standard CAD software. The software module accepts input which was generated by a user, and instructs the CAD software to automatically perform certain operations based on the input. The methods disclosed herein can also be implemented as stand-alone software not dependent on pre-existing CAD software or a CAD framework. Such a program may implement its own GUI, and may use standard 3D software libraries for 3D model generation. Alternatively, such a program may implement its own libraries for generating 3D models.

For the purposes of this disclosure, the methods disclosed herein are implemented in conjunction with software having a graphical window for accepting drawing input from a user. The software may perform certain operations based on user input and may perform other operations automatically as specified herein. The user may specify certain operations with input from the keyboard or mouse, or a combination thereof.

Generally, this disclosure will provide certain methods of accepting simplified user input and automatically generating certain three-dimensional CAD solid models. When these methods are initiated, a user begins by entering simplified input. During the execution of these methods, the software may automatically perform certain known CAD operations. The accepting of user input and the automatic performance of certain known CAD operations are completed in the order specified below, as explained in the discussion regarding the various methods. Upon completion of these methods, a 3D CAD solid model is generated.

To begin utilizing any of these methods, the user indicates to the software a desire to utilize one of these methods. This can be done by selecting a UI element displayed by the software, such as a button in a toolbar, a menu element in a dropdown menu, or by other known means. Once the user has selected which method to use, the software begins accepting the simplified input from the user. The specific simplified input and the model generated from that input depends on the method selected.

The collection of methods for permitting non-technical users to easily create 3D models will now be described. In a first group of methods (also referred to as "the ellipsoid methods" herein), input is accepted and an ellipsoid or sphere is generated. In a second group of methods (also referred to as "the tubular methods" herein), input is accepted, and a tubular structure is generated. In a third set of methods (also referred to as the "surface offset" methods), input is accepted, and a solid is created using a surface offset operation. The resulting solid may be generated from a 2D curve or a 3D curve. Further details will be provided below.

The methods will be described below in the context of software including a graphical input window which allows a user to draw certain graphical elements. It should be understood that any other known input method for allowing a user to input 2D or 3D graphical elements may be used, such as, without limitation, a command line or 3D motion detecting hardware for detecting a user's hand movements in three-dimensional space.

The Ellipsoid Methods

The Ellipsoid methods consist of six related methods of accepting simplified user input and generating a sphere or an ellipsoid. In all such methods, the user draws a curve (a "primary curve") in a graphical input window. The curve is analyzed to determine features of an ellipsoid to be generated—specifically, at least two of the radii of the ellipsoid. Optionally, the user may also input a single point in the graphical window to specify the third radius of the ellipsoid.

In a first Ellipsoid method, an ellipsoid is generated from an open curve. The user simply draws (or selects) an open curve into the graphical window. This is the primary curve. The primary curve is open and therefore has two endpoints. The software automatically determines a line connecting these two endpoints. The determined line is a first diameter, $d_1$, of the ellipsoid. The first radius, $r_1$, of the ellipsoid is half of the length of that diameter. The second radius of the ellipsoid, $r_2$, is determined by finding the farthest part on the curve from the diameter $d_1$. This farthest point on the curve is called the "middle point of the curve." The line from the middle point of the curve to the diameter $d_1$ is the radius $r_2$. The third radius $r_3$ is automatically generated, and can be equal to any of the following: $r_1$, $r_2$, or any other value determined in relation to $r_1$ and/or $r_2$. These three radii are used to generate a solid three-dimensional ellipsoid CAD model.

In a second Ellipsoid method, an ellipsoid is generated from an open curve (the primary curve) in a similar manner as in the first Ellipsoid method. The user draws (or selects) an open curve into the graphical window, and radii $r_1$ and $r_2$ are determined from the shape of that open curve, in a similar manner as described above. However, in this second Ellipsoid method, the third radius $r_3$ is determined by user input as follows. Once the user has drawn the open curve, $r_1$ and $r_2$ are determined, and then the user is prompted to select an additional point to indicate the third radius $r_3$. One way to allow a user to indicate the third radius $r_3$ is by prompting a user to click on a point on the screen. The distance between the location of the user's mouse click and a reference point on the screen determines the length of radius $r_3$. The distance used to determine the radius $r_3$ is preferably the distance, measured in the plane of the screen, between the user's mouse click and the reference point on the screen. In one preferred embodiment, the reference point is the middle point of the curve. Optionally, after being prompted for the $r_3$ input, but before clicking to provide that input, as the user moves the mouse, the software can display a "preview" of an ellipsoid in which the radius $r_3$ is continuously changing as the user moves the mouse, in order to provide the user with an idea of the final shape of the ellipsoid prior to actually receiving the input determining the radius $r_3$. Using the middle point of the curve as the reference point provides the user with an impression of "stretching" the ellipsoid by moving the mouse farther away from and closer to that middle point during this preview procedure. These three radii are used to generate a solid three-dimensional ellipsoid CAD model.

In a third Ellipsoid method, a sphere is generated from an open curve. The user draws (or selects) an open curve (the primary curve) into the graphical window, and the diameter is equivalent to the line drawn between the endpoints of the curve. A sphere is automatically generated with this diameter.

In a fourth Ellipsoid method, an ellipsoid is generated from a closed curve. A user draws (or selects) a closed curve (the primary curve) into a graphical window. The software automatically determines the three radii of the ellipsoid by analyzing the closed curve drawn into the graphical window. A diameter, $d_1$, is determined based on two points on the closed curve. The first of those two points is the start point of the closed curve, which is the point at which the user began drawing the closed curve. The second of those two points is the farthest point on the closed curve from the first of those two points. The line drawn between these first and second points is the diameter. The first radius $r_1$ is half of this diameter. The second radius $r_2$ is determined by drawing a line from the diameter to the farthest point on the curve from the diameter. This farthest point on the curve is termed the "middle point." The third radius $r_3$ is automatically generated, and can be equal to any of the following: $r_1$, $r_2$, or any other value determined in relation to $r_1$ and/or $r_2$.

In a fifth Ellipsoid method, an ellipsoid is generated from a closed curve (the primary curve) in a similar manner as in the fourth Ellipsoid method. The user draws (or selects) a closed curve into the graphical window, and radii $r_1$ and $r_2$ are determined from the shape of that closed curve, in a similar manner as described above. However, in this fifth Ellipsoid method, the third radius $r_3$ is determined by user input. Once the user has drawn the curve, the user is prompted to select an additional point to indicate the third radius $r_3$. One way to allow a user to indicate the third radius $r_3$ is by prompting a user to click on a point on the screen. The distance between the location of the user's mouse click and a reference point on the screen determines the length of radius $r_3$. The distance used to determine the radius $r_3$ is preferably the distance, measured in the plane of the screen, between the user's mouse click and the reference point on the screen. In one preferred embodiment, the reference point is the middle point of the curve. Optionally, after being prompted for the $r_3$ input, but before clicking to provide that input, as the user moves the mouse, the software can display a "preview" of an ellipsoid in which the radius $r_3$ is continuously changing as the user moves the mouse, in order to provide the user with an idea of the final shape of the ellipsoid prior to actually receiving the input determining the radius $r_3$. Using the middle point of the curve as the reference point provides the user with an impression of "stretching" the ellipsoid by moving the mouse farther away from and closer to that middle point during this preview procedure.

In a sixth Ellipsoid method, a sphere is generated from a closed curve. The user draws a closed curve into the graphical window, and the diameter is determined by the following two points: 1) the start/end point of the closed curve; and 2) the farthest point on the curve from point 1. A sphere is automatically generated with this diameter.

The Tubular Methods

The Tubular methods consist of six related methods of accepting simplified user input and generating a "tubular" structure. In all such methods, the user draws (or selects) one or two curves (the "primary curve(s)") in a graphical input window. These one or two curves are used to conduct a two-rail sweep operation to generate a 3D tubular surface. The cross-section(s) used for the two-rail sweep operation may be determined automatically, provided by the user, or partially determined automatically and partially provided by the user. Preferably, a circular cross-section is used for the two-rail sweep. Two end caps are generated and added to the tubular surface to generate a solid tubular structure. The end caps may simply be circular surfaces or may be any other shape as desired.

In a first Tubular method, a tubular structure is generated from a closed curve. A user draws the closed curve into the graphical window. The software analyzes the closed curve to generate two open curves. To generate the two open curves, the software analyzes the closed curve to determine two axis points. One way to determine two axis points is to analyze the closed curve to find two local maxima in slope. These local maxima in slope should represent the points at which the closed curve has the sharpest curvature. Other known ways to automatically determine two axis points are of course possible. The closed curve is separated at the axis points to form two open curves. The two open curves may be further processed to spatially separate the endpoints of the two open curves. This separation is made so that a two-rail sweep operation performed on the curves can generate locations for "end caps." The separation can be made by cutting off a small portion (for example, 5% of the length) of the ends of the two curves, by applying a "smoothing" function to the ends of the two curves, or through other known means.

A two-rail sweep operation is performed on the two open curves. Two cross-sections are used for the two-rail sweep— one at each end of the two open curves. A default shape may be used for the shape of the cross-sections. In a preferred embodiment, the default shape is a circle, but other shapes may be used. The size and location of these cross-sections must be determined to perform the two-rail sweep. One way of determining the size and location of the first and second cross-sections is as follows. First, a mean curve is determined. This mean curve is the curve that lies mathematically between the two open curves. Next, a tangent of this mean curve is taken at both ends of the mean curve to determine the direction of the two cross-sections. Next, the size of the cross-sections must be determined. For circular cross-sections, the distance between the end-points of the two open curves at each end of the two open curves are used to determine a diameter of the circular cross-section. Thus, the size and direction of the circular cross-sections are determined. Cross-sections can thus be generated using this information.

Output from the two-rail sweep should be a tubular surface with a circular cross-section. End caps are generated to be placed at the locations of holes or gaps at the ends of the tubular surface. The end caps may be automatically generated as follows. Since the tubular surface generated from the two-rail sweep operation has two end-curves (e.g., circular end-curves equivalent to the circular cross-sections discussed above), these end curves can be used to form end caps. A surface can be generated which is defined by the end curves. The surface can be flat or curved, or have any other desired shape. Two end-caps are generated in this manner— one for each end of the tubular surface. The tubular surface is added to the two end caps to generate a solid tubular structure.

In a second Tubular method, a tubular structure is generated from a closed curve in a similar manner as described with respect to the first Tubular method, but with input from a user to determine the two axis points (and therefore the separation of the closed curve and resultant generation of two rail curves). After the user has drawn (or selected) the closed curve into the graphical window, the user is prompted to select two points lying on that closed curve. The two selected points are then used to split the closed curve to generate the two rail curves. Specifically, the closed curve is cut, at the points chosen by the user, such that two open curves are generated. Separation of the two curves, addition of the end-caps and the two-rail sweep operation are performed in a similar manner as described above with respect to the first Tubular method. The end caps and the surface resulting from the two-rail sweep are joined to generate a 3D solid model.

In a third Tubular method, a tubular structure is generated from a closed curve in a similar manner as described with respect to the first and second Tubular methods, but with additional input from the user to determine the cross-sections, and thus end caps, for the two-rail sweep operation. Specifically, the third Tubular method prompts a user to click on four points on the closed curve to specify where the end caps will be generated and how big they will be. In the third Tubular method, a user draws (or selects) a closed curve into the graphical window and then clicks on four points on the curve. The locations of the four points are analyzed to determine 1) two curves with which to perform a two-rail sweep operation (the "rail curves"); and 2) the locations and sizes of two end-caps. In one preferred embodiment of analyzing the locations of the four points, the software determines four curve segments from the four points by cutting the closed curve four times, at the locations specified by the four points. The two longest segments will be the rail curves. The two smallest segments will be used to determine the locations and sizes of cross-sections used to perform a two-rail sweep operation, as well as the two end caps, in a manner similar to the method described with respect to the first Tubular method (i.e., a mean curve is generated, tangents are taken at the end of the mean curve to determine directions of the cross-sections, and the distance between the two rail curves are used to determine diameters for the cross-sections, as described above). A two-rail sweep is performed using the rail curves and cross-sections to generate a tubular surface. Two end caps are generated in a similar procedure as described above with reference to the first Tubular method. The two end-cap surfaces are added to the tubular surface to generate a tubular solid.

In a fourth Tubular method, a tubular structure is generated using a two-rail sweep from a closed curve in a similar manner as described with respect to the first three Tubular methods, except the user specifies one or more "intermediate" cross-section curves for the middle of the tubular structure. The "intermediate" cross-section will be used to perform a two-rail sweep, along with "end cross-sections" provided for the ends of the tubular structure. This will be discussed in further detail below.

In the fourth Tubular method, a user first draws a closed curve into the graphical window. This closed curve will be referred to as the "primary closed curve" during the discussion of the fourth Tubular method. Then a user is prompted to enter one or more closed or open cross-section curves. The shape and location of the closed or open cross-section curves drawn by the user are analyzed to determine the following parameters of intermediate cross-section(s): 1) the shape of an intermediate cross-section of the tubular structure to be generated; 2) the location of the intermediate cross-section of the tubular structure to be generated; and 3)

the orientation of the intermediate cross-section of the tubular structure to be generated.

The analysis of the closed or open cross-section curves to determine the intermediate cross-section parameters may be done in the following manner. If a closed cross-section curve is entered by the user, the shape of that closed cross-section curve is used to determine the shape of the intermediate cross-section. In a preferred embodiment, the shape of the intermediate cross-section is simply the shape of the curve drawn by the user. The user will draw the curve in 3D space. This user entry in 3D space specifies the shape of the curve, the location and the orientation. If an open cross-section curve is entered by the user, the open curve is first checked to see if it intersects or is close to the primary closed curve at two locations. If so, an intermediate cross-section is generated having cross-section parameters which are automatically determined, as follows: First, the shape of the intermediate cross-section will be a default cross-section. This default shape may be a circle, or may be any other shape. Second, the location of the intermediate cross-section will be determined by the points at which the open curve intersects or is close to the primary closed curve. The intermediate cross-section is located such that it intersects the primary closed curve at those two points. Finally, the orientation of the intermediate cross-section is determined such that it is in alignment with the line running from the two points at which the open curve intersects or is close to the primary closed curve.

To determine the rail curves, axis points are determined. The closed curve is cut at the two axis points to generate the rail curves. The end points of the rail curves are separated by: 1) applying a bit of smoothing to the ends of the rail curves; 2) cutting off a terminal portion of the rail curves; or 3) spatially separating the rail curves, or through any other known methods. The end cross-sections are determined in a similar manner as is described with respect to the first Tubular method (i.e., a mean curve is generated, tangents are taken at the end of the mean curve to determine directions of the cross-sections, and the distance between the two rail curves are used to determine diameters for the cross-sections, as described above).

A two-rail sweep operation is performed, using all end cross-sections and intermediate cross-sections, as well as the two rail curves, thereby generating a Tubular surface. Two end caps are generated as surfaces based on the end cross-sections, as described above with respect to the first Tubular method. The two end caps are added to the tubular surface to generate a tubular solid.

In a fifth Tubular method, a tubular solid is generated in a similar manner to the first Tubular method, except that instead of the user specifying one closed curve, the user specifies two open curves. The two open curves specified by the user are the two rail curves used to perform a two-rail sweep. The cross-sections used for the two-rail sweep operation are determined in a similar manner as is described with respect to the first Tubular method. A two-rail sweep operation is performed to generate a tubular surface, and two end caps are generated in a similar method as is described with respect to the first Tubular method. The tubular surface and end caps are added together to generate a tubular solid.

In a sixth Tubular method, a tubular solid is generated in a similar manner as in the fourth and fifth Tubular methods. Specifically, a user specifies two open curves, and may also specify one or more open or closed cross-section curves, from which intermediate cross-sections are generated as described with respect to the fourth Tubular method. A two-rail sweep is run in a similar manner as with respect to the fifth Tubular method—that is, a two-rail sweep is run, which includes the intermediate cross-sections generated as well as generated end cross-sections. The tubular surface generated is added to the generated end caps, resulting in a Tubular solid.

Surface Offset Methods

Figure 10:
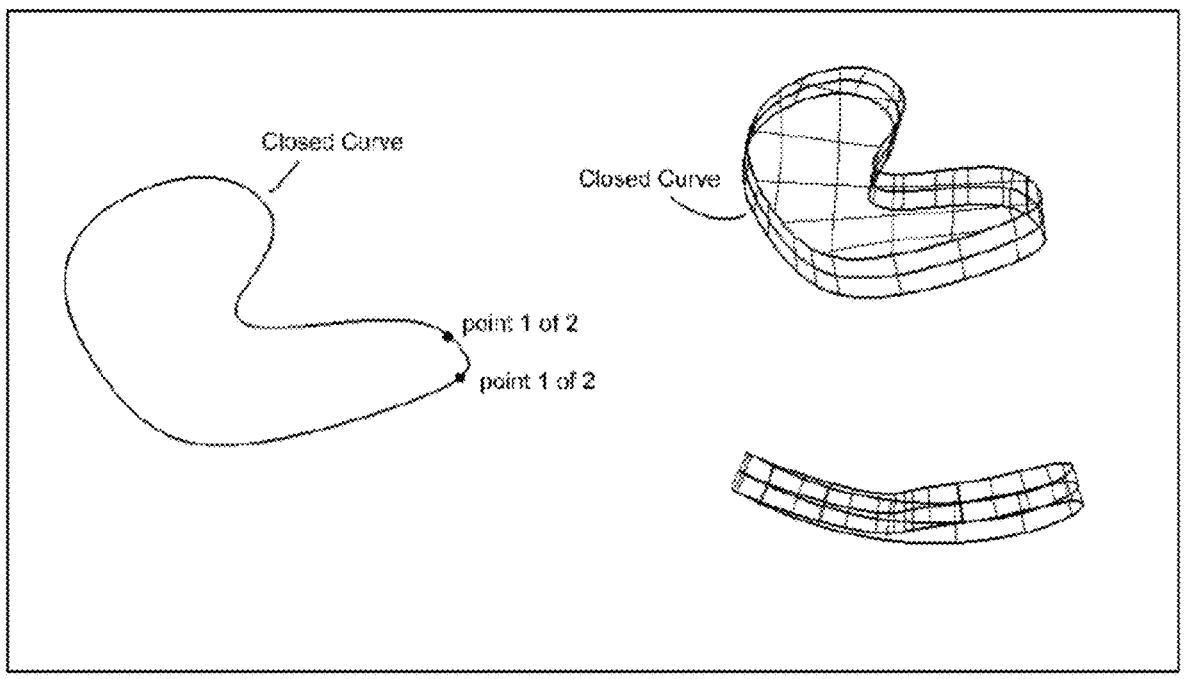
FIG. 10 illustrates an exemplary embodiment surface offset method, in accordance with aspects of the present invention.

The Surface Offset Methods consist of one method of accepting simplified user input and generating a surface offset structure, i.e., a structure having a shape which would result from performing a CAD surface offset operation (with closed sides) on a curve (as shown in FIG. 10). In this method, the user draws or selects a closed curve into a graphical input window. The curve may be 2D or 3D. The software then prompts the user for input to determine the thickness of a surface offset operation to be applied to the closed curve. Although the thickness may be input by the user in any number of ways, two preferred methods are as follows. In a first preferred method, after the user has drawn the closed curve, the software tracks a user's mouse movements and continuously displays solids depending on the distance from the current position of the mouse to the last point clicked on the curve. As the user's mouse moves, the solid which is displayed grows or shrinks in size, depending on the mouse position. When the user clicks, the surface offset thickness is decided, and a 3D solid is generated by performing a surface offset operation (with closed sides) on the closed curve to a thickness equal to the decided thickness. In a second preferred method, a user clicks on a first point on the screen, and then a second point on the screen. The distance between these two points is used to generate a surface offset solid having a thickness equal to that distance. Alternatively, the thickness need not be exactly equal to the distance, but may be determined using the distance as a factor. For example, the distance may be scaled up or down.

In the surface offset method, one preferred method of generating a surface offset solid is as follows. Once a user has provided all necessary input, including the closed 2D or 3D curve and the thickness, the software generates a surface from the closed 2D or 3D curve. This surface is preferably generated using a known CAD method referred to as "Patch." Patch simply accepts a curve (2D or 3D) and outputs a surface from the curve. Subsequently, a surface offset operation is applied to the output from the Patch operation. To ensure that the output of the surface offset operation is solid, the surface offset operation is performed with the "closed sides" parameter set to yes. This ensures that sidewalls are generated to enclose the solid generated by the surface offset method.

It should be understood that the 3D models generated with the methods disclosed herein are solid and are therefore 3D printable. The models are all solid because output from the models all fully encloses a volume. For example, the ellipsoid methods enclose an ellipsoid-shaped volume, the tubular methods enclose a volume shaped as a tube, terminating in end caps, and the surface offset methods enclose a volume comprising offset surfaces with closed sides. To 3D print any of the 3D models generated using the methods disclosed herein, output from the software may be generated in the form of a CAD file (such as .dwg, .stl and other commonly used file formats), or as other forms of exported data (raw data, or custom format data). This output is provided to any 3D printing system capable of accepting the output provided. Such systems may include, for example, without limitation, stereolithography systems, selective laser sintering systems, fused deposition modeling systems, or any other 3D printing systems capable of accepting 3D model data and generating a physical object from said data. The 3D printing system may be operated by the same party as the party designing the 3D model, or may be operated by a different party. Further, the 3D models generated with the methods disclosed herein may be designed fully by a single party, or by a plurality of parties working independently or in concert.

EXAMPLES

The present invention provides a system and method for generating a representation of an architectural structure, which is printable by a 3D printer.

Figure 11:
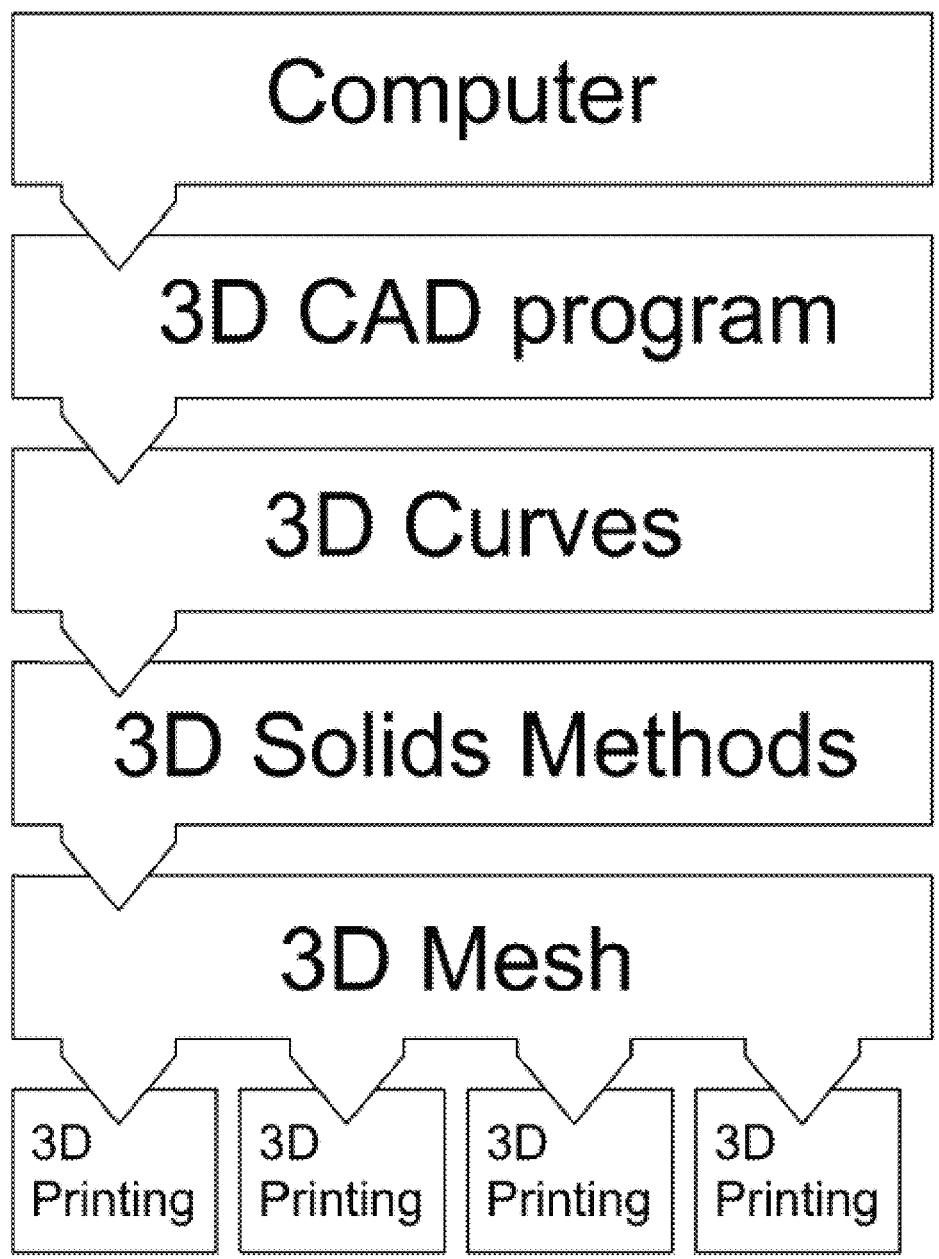
FIG. 11 illustrates a schematic flow chart of an exemplary 3D printing process using the model in accordance with aspects of the present invention.

FIG. 11 shows a simplified schematic diagram of a process of creating and printing a 3D object, in accordance with the present invention. In one known example, first a user is introduced to a 3D drawing program, for example a 3D CAD program; second, at the user interface, a user inputs into the program some primitives, such as points, lines; third, the computer software implements the 3D solid methods described by the present invention, creating a 3D model based on the user input; fourth, the 3D model is further converted to a 3D mesh model by the computer software for 3D printing; and fifth, the software sends out printing commands to the multiple 3D printers locally or on the network for printing.

The following embodiments illustrate objects and processes to create 3D printable models by the methods described in the present invention. A user with limited technical knowledge can use a combination of the different methods described herein to create either models comprised of a simple skeleton structure with a lot of open space, such as a shelf or a chair, or to create a sophisticated architecture with a lot of small parts and a lot of volume, such as a toy truck or a motorcycle, suitable for 3D printing.

When approaching a 3D printable target having a multiple scaffold skeleton, the user creates the structure in subgroups of solid parts to form a singly connected 3D model.

Figure 12:
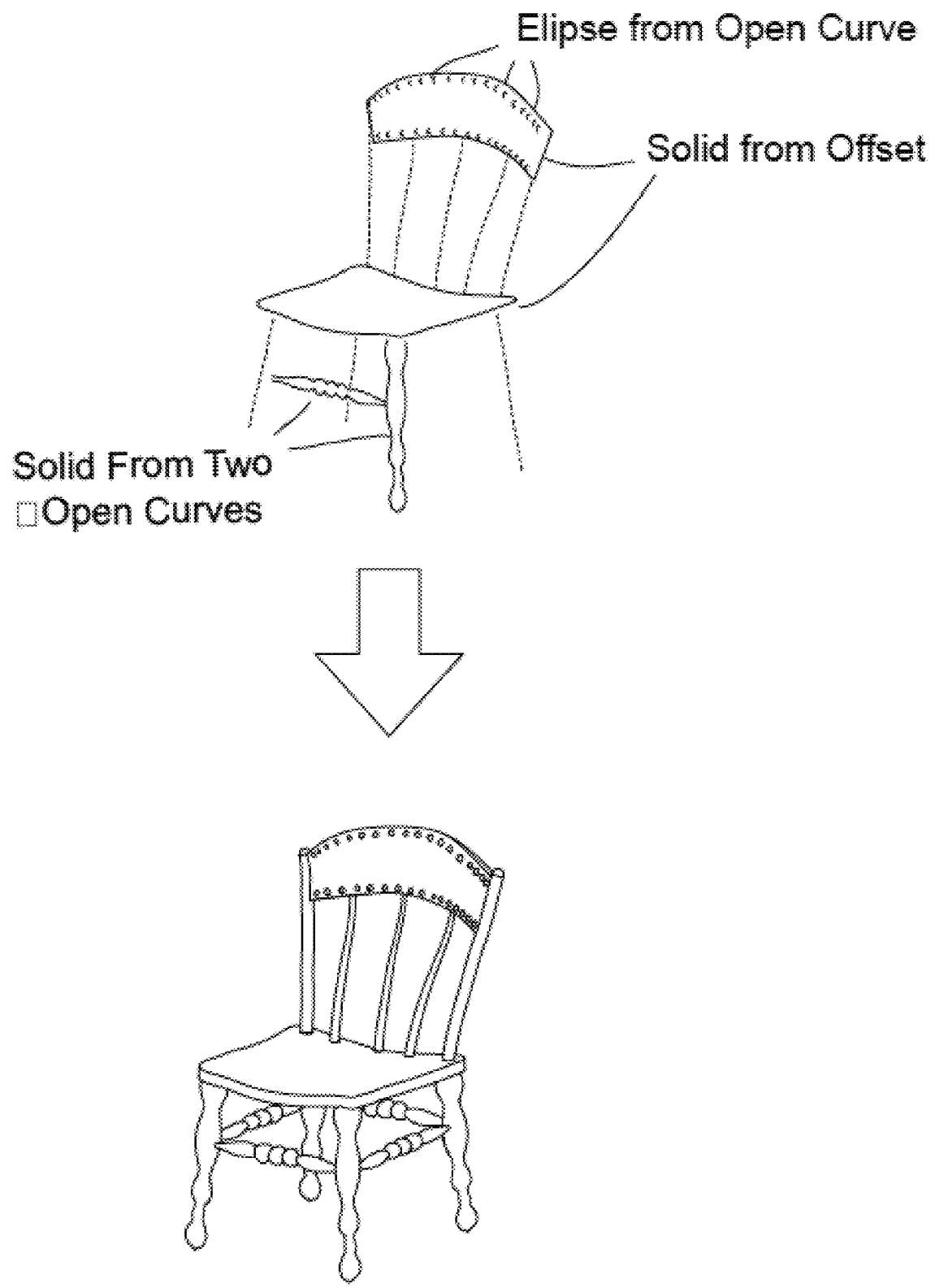
FIG. 12 illustrates an exemplary process of creating a chair model in accordance with the aspects of the present invention.
Figure 13:
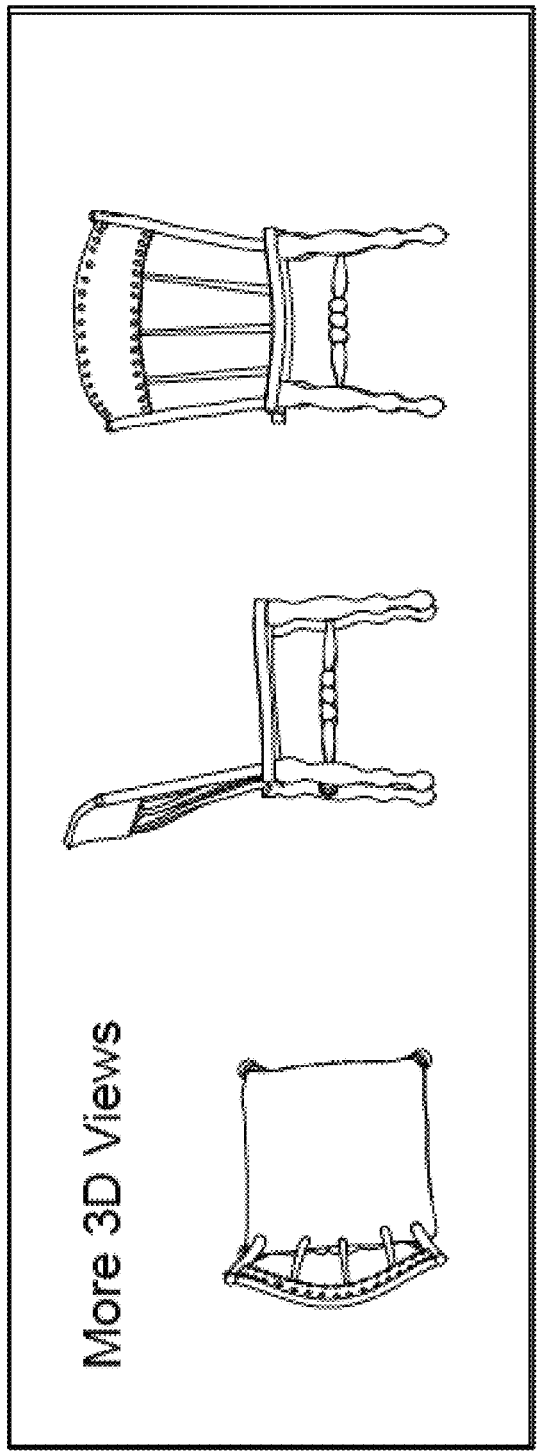
FIG. 13 illustrates additional 3-dimensional views of the chair model in accordance with the aspects of the present invention.
Figure 14A:
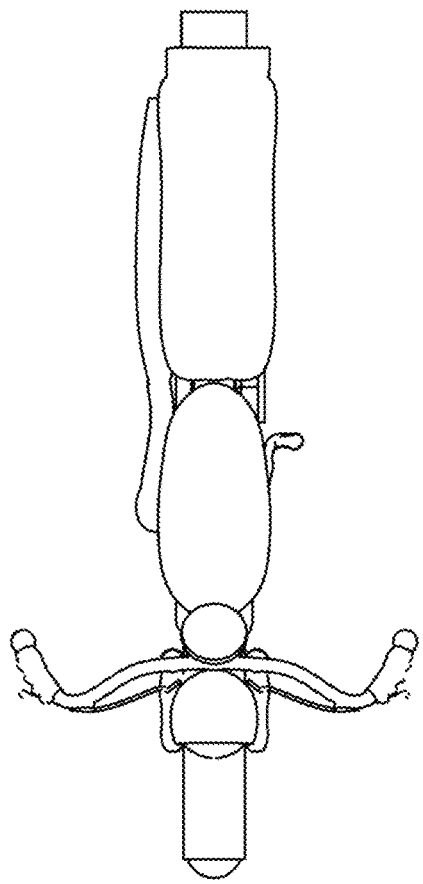
FIGS. 14a-b and 15a-b illustrate additional 3-dimensional views of a motorcycle model in accordance with the aspects of the present invention.
Figure 14B:
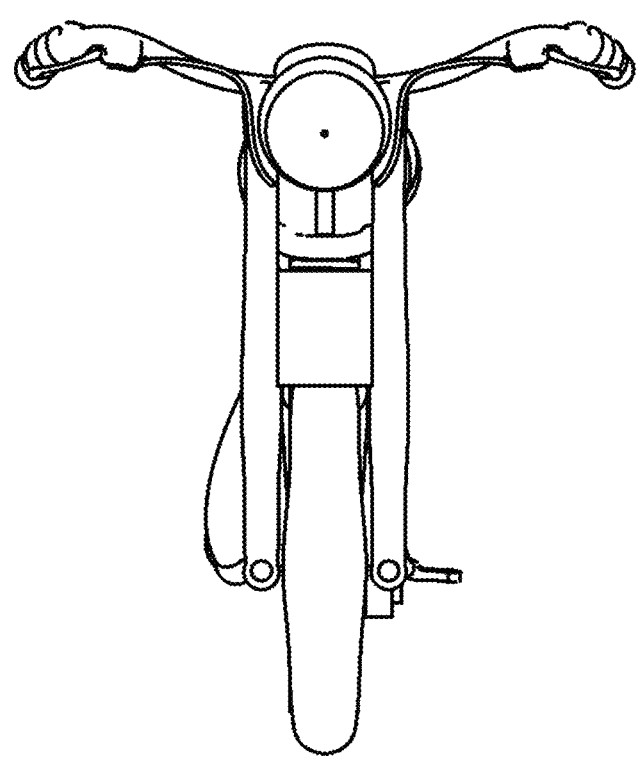
Figure 15A:
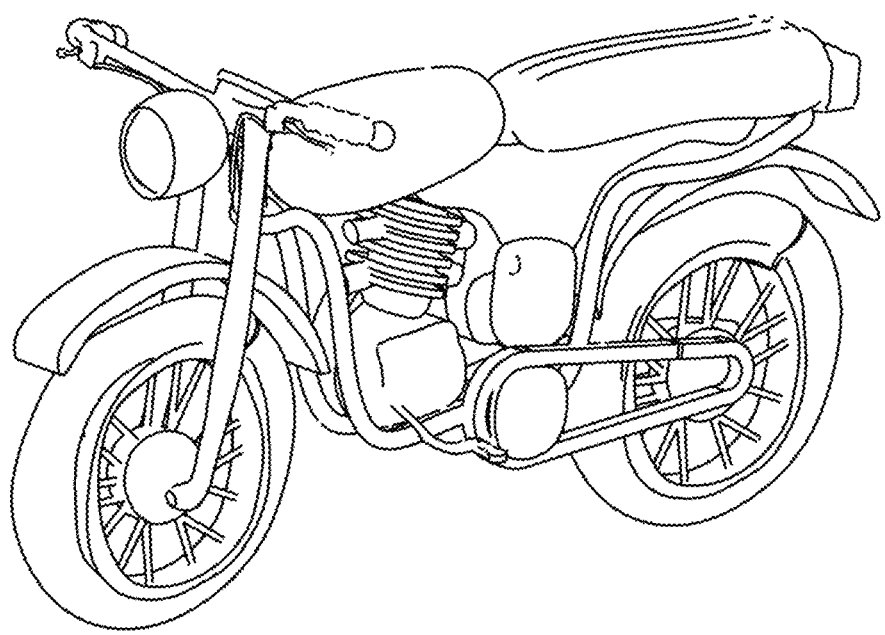
Figure 15B:
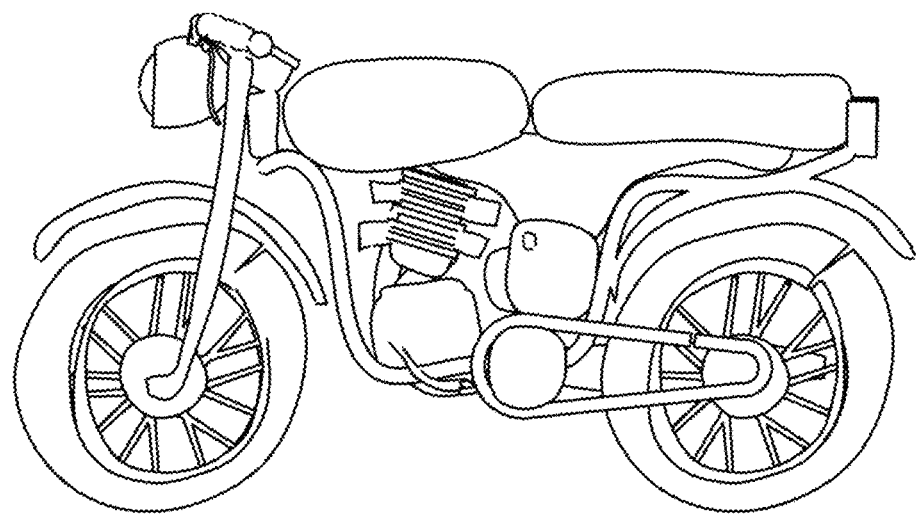

One exemplary embodiment is a chair, as shown in FIGS. 12 and 13. The chair consists essentially of about 15 parts in five distinct 3D geometries, including a top rail, a seat, four legs, a handful of spindles connecting the top rail to the seat, and four stretchers, supporting the four legs.

Referring to FIG. 12, the user first is presented an open 3D space. The user then inputs a 3D set of curves for forming a conventional skeleton in one coherent manner. Then the user builds the individual parts into 3-dimensional objects using the methods described herein.

In one example, the seat of the chair is defined as a 3D closed curve using the surface offset method (as shown in FIG. 12). After the closed 3D shaped curve for the seat is selected in a graphical input window the software then prompts the user for input for a thickness information of a surface offset operation to be applied to the closed curve. The thickness can be entered by the user by measuring the distance between two user selected points, by the input of a numerical number using the key board, or by the use of an on screen slider. The computer subsequently generates a 3D solid by performing a surface offset operation (with closed sides) on the closed curve to the thickness equal to the thickness input employed by the user. The user then is able to adjust the thickness by additional scaling up or shrinking down functions.

In a second example, the top rail of the chair (the upper seat back) is defined as a 3D closed curve using the surface offset method (as shown in FIG. 12). In a similar manner in which the seat was created the top rail is made into a 3D shape using the surface offset method. Additionally artistic embellishments can be added in the form of a row of spheres, embedded into the top rail of the chair. These spheres can be made by the user selecting the open curves, and using the third Ellipsoid method, from which spheres are formed.

Referring to FIG. 12, the legs of the chair and the four stretchers (the wood pieces that connect the individual legs) have substantially elongated volumes. Both legs and stretchers can be drawn using tubular methods including open curves. In one example, the legs of the chairs have features substantially resembling baluster shafts. As shown in FIG. 12, the one exemplary leg includes four uninterrupted baluster shaft features. The four baluster shaft features can be drawn individually and connected by the user, but preferably the legs are drawn from two open curves using one of the tubular methods and the curve is input by the user from one end point to the other end point including the baluster curvature without interruption. In the same manner, FIG. 12 further illustrates one of the exemplary stretchers which has features that substantially resemble ball turnings. The ball turnings can be drawn individually, for example, using the third Ellipsoid method, generating a sphere from an open curve, having the diameter equivalent to the line drawn between the endpoints of the curve.

But preferably, the ball turnings are drawn using two open curves without interrupted end points.

Once the 3D chair model is built, optionally, further editing can be performed. Such editing includes modifying the scale of the model, rotation, flip and optionally splitting of the structure. Rotation and flip can help the user to review and better visualize the structure from different angles and views. Splitting is useful if the user wants to print half or any part of the structure to validate or view the structure before printing the entire structure.

In one example, the scaling is performed manually based on a user-provided predefined scale factor. In one instance, the user chooses a small scaling factor to print the first batch of miniature prototypes before printing a subsequent batch of regular-sized products, in order to minimize material usage or cost.

Another exemplary embodiment of the present invention is a motorcycle, as shown in FIGS. 14a-b and 15a-b. The motorcycle consists of more than 30 parts in over 15 distinctive 3D geometries, including tires, head lamp, front fork, speedometer, grips, tailpipe, end of handlebars, seat, gas tank, wheel rims, fenders, motor detail, wheel hubs, tail light and chain.

In one example, the user disintegrates the 3D motorcycle model into a subgroup of parts. The sum of all the parts, where their volumes intersect, form a whole which can be 3D printed.

In one known example, the tires, headlamp, front fork, speedometer, grips, and tailpipe were created using the Tubular Method employing two open curves; end of handlebars were created using first Ellipsoid method using one open curve. The seat and gas tank were created using the Tubular Method, using one closed curve and two user selected points; and wheel rims, fenders, motor detail, wheel hubs, tail light and chain were created using the surface offset method.

In one example, the motorcycle has two tires, which have the same dimensions and geometries. The software methods of the present invention allow for a copy/paste function, for example, copying and pasting one 3 dimensional subgroup of the tire model. Optionally, in a further example, a 3D tire subgroup model is created and serves as a template, whereby a motorcycle having more than one wheel or tire can be built from templates instead of primitives.

As shown in the 3D views of the motorcycle, the seat of the motorcycle substantially resembles a lotus root, having a cylindrical shaped body and two opposing flat surfaces. The 3 dimensional structure of the seat is not a regular ellipsoid or tubular structure. In one known example, the seat is built first using the Second Tubular Method, employing one closed curve and 2 user selected points to form a shape first, which is copied and pasted three times to create a full seat.

In accordance with the aspects of the present invention, after the 3D model is built on the graphic user interface, a validation step is strongly recommended before printing. In order for the model to be valid for 3D printing as a single connected object each 3D solid should intersect with another 3D solid in the group. If all 3D solids are intersecting in space with at least one other 3D solid from the group, the combined 3D solids will be 3D printed as a single object. If a particular 3D solid is not intersecting with another member of the group, then it can be manipulated using move, scale, rotation, or other standard CAD methods until it intersects with another member of the group.

The application has disclosed a collection of methods for permitting non-technical users to easily create 3D models suitable for 3D printing. An ellipsoid or sphere, a tubular structure, or surface offset is provided to generate three-dimensional solid structures to allow rapid modeling and fast prototyping.

This disclosure recites several methods of automatically determining various geometrical parameters, and of automatically performing certain CAD operations. It should be understood that for any of said CAD operations, any substitutes for such CAD operations which achieve the goals of said CAD operations may be utilized. For example, while the disclosure recites that, in the third Tubular method, the "rail curves" are determined by determining the longest segments out of the four segments generated by cutting the closed curve with the four user-selected points, other known methods of generating rail curves may be used. Additionally, references are made herein to "default cross-sections." These default cross-sections may be pre-specified by a user, hard coded into the software, or automatically determined by the software based on context.

What is claimed is:

1. A computer program product including a non-transitory computer readable medium having instructions for causing a computer to implement a method of generating a three-dimensional (3D) CAD solid model, the method comprising: steps of Computer-Aided Design (CAD) computer processing and generate the three-dimensional CAD solid design suitable for a 3D printer, said steps comprising:
   accepting a user's input of one or more primary curves of data points wherein each primary curve of data points is corresponding to a path of motion by a detecting computer input device;
      wherein accepting a user's input comprising a thickness data value;
   automatically performing a surface operation function of CAD utilizing the one or more primary curves of data points to generate a first surface shape of data points;
   automatically performing a surface offset operation function of CAD with closed sides utilizing the first surface shape of data points to generate a second offset surface shape of data points and a one or more closed side surfaces shape of data points; and
   automatically generating a solid three-dimensional CAD model utilizing the first surface shape of data points, the second offset surface shape of data points and the one or more closed side surfaces shape of data points.

2. The computer program product according to claim 1, wherein the method further comprising: using the solid three-dimensional CAD model for 3D printing.

3. The computer program product according to claim 1, wherein at least one of the one or more primary curves of data points is a 3D curve and wherein the first surface shape of data points is 3D.

4. The computer program product according to claim 3, wherein the method further comprising: automatically performing a surface operation function of CAD utilizing the one or more primary curves of data points to generate the first surface shape of data points, without additional input from the user; automatically performing the surface offset operation function of CAD with closed sides utilizing the first surface shape of data points to generate the second offset surface shape of data points and the one or more closed side surfaces shape of data points; without additional input from the user excluding the thickness data value which may be preset.

5. The computer program product according to claim 4, wherein the method further comprising: automatically performing a patch surface operation function of CAD utilizing the one or more primary curves of data points to generate the first surface shape of data points, without additional input from the user.

6. The computer program product of claim 4 wherein the computer input device comprises a 3D motion detecting hardware for detecting a user's hand movements in three-dimensional space.

7. The computer program product according to claim 1, wherein the method further comprising: automatically performing a surface operation function of CAD utilizing the one or more primary curves of data points to generate the first surface shape of data points, without additional input from the user; automatically performing the surface offset operation function of CAD with closed sides utilizing the first surface shape of data points to generate the second offset surface shape of data points and the one or more closed side surfaces shape of data points, without additional input from the user excluding the thickness data value which may be preset.

8. A system comprising: a computing device comprising a monitor, keyboard and mouse; and a computer program product including a non-transitory computer readable medium having instructions for causing the computing device to implement a method of generating a three-dimensional CAD solid model, the method comprising: configuring a plurality of computer processors, said plurality of computer processors being instructed to perform the steps of Computer-Aided Design (CAD) computer processing and generate a three-dimensional CAD solid design suitable for a 3D printer, said steps comprising: accepting a user's input of one or more primary curves of data points wherein each primary curve of data points is corresponding to a path of motion by a detecting computer input device;
   wherein accepting a user's input comprising a thickness data value;
   automatically performing a surface operation function of CAD utilizing one or more primary curves of data points to generate a first surface shape of data points;
   automatically performing a surface offset operation function of CAD with closed sides utilizing the first surface shape of data points to generate a second offset surface shape of data points and a one or more closed side surfaces shape of data points; and automatically generating a solid three-dimensional CAD model utilizing the first surface shape of data points, the second offset surface shape of data points and the one or more closed side surfaces shape of data points.

9. The system according to claim 8, the method further comprising: using the solid three-dimensional CAD model for 3D printing.

10. The system according to claim 8, wherein at least one of the one or more primary curves of data points is a 3D curve and wherein the first surface shape of data points is 3D.

11. The system according to claim 10, wherein the method further comprising: automatically performing a surface operation function of CAD utilizing the one or more primary curves of data points to generate the first surface shape of data points, without additional input from the user; automatically performing the surface offset operation function of CAD with closed sides utilizing the first surface shape of data points to generate the second offset surface shape of data points and the one or more closed side surfaces shape of data points, without additional input from the user excluding the thickness data value which may be present.

12. The system of claim 11, wherein the computer input device comprises a 3D motion detecting hardware for detecting a user's hand movements in three-dimensional space.

13. The system according to claim 12 wherein the system further comprises a 3D printer; wherein the steps further comprise accepting from a second user, working in concert with the user in claim 12 an input comprising a second 3D CAD model that is combined with the first 3D CAD solid model; and the combined first 3D CAD solid model and second 3D CAD model are used for 3D printing as a single object.

14. The system according to claim 13, wherein the instructions stored in the non-transitory computer readable medium further cause the computing device to combine a 3D template with the first 3D CAD solid model or the second 3D CAD model.

15. The system according to claim 13, wherein the instructions stored in the non-transitory computer readable medium further cause the computing device to save the first 3D CAD solid model or the second 3D CAD model as a template.

16. The system according to claim 13, wherein the instructions stored in the non-transitory computer readable medium further cause the computing device to validate the first 3D CAD solid model or the second 3D CAD model for 3D printing using a checklist.

17. The system according to claim 11, wherein the method further comprising: automatically performing a patch surface operation function of CAD utilizing the one or more primary curves of data points to generate a first surface shape of data points, without additional input from the user.

18. The system according to claim 8, wherein the method further comprising: automatically performing a surface operation function of CAD utilizing the one or more primary curves of data points to generate the first surface shape of data points, without additional input from the user; automatically performing the surface offset operation function of CAD with closed sides utilizing the first surface shape of data points to generate the second offset surface shape of data points and the one or more closed side surfaces shape of data points, without additional input from the user excluding the thickness data value which may be preset.

* * * * *